United States Patent [19]

Takahashi et al.

[11] Patent Number: 5,259,735
[45] Date of Patent: Nov. 9, 1993

[54] EVACUATION SYSTEM AND METHOD THEREFOR

[75] Inventors: Kazue Takahashi, Tsuchiura; Shinjiro Ueda, Abiko; Manabu Edamura, Ibaraki; Naoyuki Tamura; Kazuaki Ichihashi, both of Kudamatsu, all of Japan

[73] Assignee: Hitachi, Ltd., Tokyo, Japan

[21] Appl. No.: 873,175

[22] Filed: Apr. 24, 1992

[30] Foreign Application Priority Data

Apr. 25, 1991 [JP] Japan .................. 3-095147

[51] Int. Cl.⁵ .................. F04B 23/14; F04B 37/08; B01D 8/00
[52] U.S. Cl. .................. 417/203; 417/901; 417/205; 62/55.5; 62/100; 55/269
[58] Field of Search .................. 417/201, 203, 205, 53, 417/901; 55/269; 62/100, 268, 55.5

[56] References Cited

U.S. PATENT DOCUMENTS

| | | | |
|---|---|---|---|
| 3,392,538 | 7/1968 | Mongodin | 62/55.5 |
| 3,536,418 | 10/1970 | Breaux | 417/201 |
| 4,089,185 | 5/1978 | Kemmer et al. | 417/901 |
| 4,551,197 | 10/1985 | Guilmette | 62/55.5 |
| 4,667,477 | 5/1987 | Matsuda et al. | 62/55.5 |
| 4,679,401 | 7/1987 | Lessard et al. | 62/55.5 |
| 4,722,191 | 2/1988 | Waltrich et al. | 62/55.5 |
| 4,757,689 | 7/1988 | Bachler | 417/901 |

FOREIGN PATENT DOCUMENTS

| | | |
|---|---|---|
| 2014489 | 4/1970 | France . |
| 2380070 | 2/1977 | France . |
| 2436269 | 9/1979 | France . |

Primary Examiner—Richard A. Bertsch
Assistant Examiner—Roland G. McAndrews, Jr.
Attorney, Agent, or Firm—Antonelli, Terry, Stout & Kraus

[57] ABSTRACT

An evacuation system in an ultra-high vacuum sputtering apparatus capable of shortening the pumping time of the system. A main pump, composed of a turbo-molecular pump and a baffle is positioned upstream of a main pump and cooled to a temperature in which argon gas is not absorbed and only water is absorbed. The pump and a vacuum chamber are separated by a valve. A pipeline circulates a heating medium to rapidly heat and cool the vacuum chamber for enabling a gas discharge from the vacuum chamber whereby the pumping time can be reduced and the overall production of the system can be increased.

12 Claims, 5 Drawing Sheets

EVACUATION SYSTEM AND METHOD THEREFOR

BACKGROUND OF THE INVENTION

1. Field of the Invention

The present invention relates to an evacuation system and a method therefor for evacuating, for example, a sputtering apparatus.

2. Description of the Prior Art

A conventional evacuation system for a high vacuum sputtering apparatus includes a cryopump connected to a sputtering chamber through a valve and auxiliary pumps for performing an evacuation to obtain a pressure under which the cryopump can be actuated. The cryopump cools a baffle to an extremely low temperature of approximately 20K (absolute temperature), by using a helium refrigerator, and absorbs and exhausts gas molecules. Since the baffle is cooled to an extremely low temperature, the cryopump is excellent in exhaust ability with respect to, particularly, water. Furthermore, since the cryopump is of a storage type, even if the operation of the sputtering apparatus is stopped due to some accident, there is little influence on the outside. Therefore, a cryopump is widely used in a sputtering apparatus. However, the storage type pump is must be periodically regenerated after exhausting the gas molecules. Furthermore, since such a cryopump also has an evacuation ability with respect to argon, it is necessary to control the amount of exhausted argon gas by a valve operation in a sputtering filming apparatus using argon gas.

A cold head for cooling a baffle to approximately 150K by using a coolant is generally used to lower the pressure in a process chamber merely by increasing the exhaust amount of water molecules; or used as a cold trap to prevent oil molecules from flowing backward in an oil diffusion pump. In such cases, the cold head is connected to the process chamber through a valve, and a main pump is directly connected to the downstream side of the cold head.

In a conventional evacuation apparatus, as described above, the pumping speed with respect to gas molecules including water is as high as possible in order to shorten the time required for continuing the exhaust to obtain a desired pressure. However, since there is a limit to the pumping speed of a vacuum pump and a storage type pump such as a cryopump needs regeneration, a time period which does not contribute to production is necessary in a semiconductor manufacturing apparatus such as a sputtering apparatus. Thus, the semiconductor manufacturing apparatus requires additional time for producing the semiconductors.

In order to solve the problems relating to the additional processing time, an apparatus has been proposed which eliminates any loss of time due to the warm-up and stopping of a cooling source by switching the temperature of a coolant of a cold trap in a short time.

An apparatus of the aforementioned type is disclosed in, for example, "A User's Guide to Vacuum Technology", John F. O'Hanlon.

SUMMARY OF THE INVENTION

An object of the present invention is to provide an evacuation system and method suitable for shortening the pumping time of a semiconductor manufacturing apparatus after the apparatus is exposed to the air for maintenance and, in particular, including evacuation to achieve a high vacuum.

The above object is achieved by proper application of the vacuum chamber leak method when a semiconductor manufacturing apparatus is exposed to the air, the evacuation method at subsequent vacuum system operation, and the rapid outgassing method of gas absorbed on the inner wall of a vacuum chamber. In other words, the moisture content of leakage gas is considerably reduced, and water molecules are thereby prevented from being absorbed on the inner wall of the vacuum chamber during the leakage. Then, a means capable of rapidly heating the vacuum chamber is prepared so that baking of the vacuum chamber after achieving a high vacuum region can be carried out in a short-time. At this time, since high vacuum and ultrahigh vacuum pumps need, the warm-up time, the evacuation system must be capable of being operated in exposure to the air without being stopped. In order to increase the pumping speed with respect to water and shorten the pumping time, a cold trap is mounted and the temperature of the cold trap is kept at a temperature at which it is difficult to absorb argon during a sputtering operation. Furthermore, it is advantageous, after baking, to forcibly cool the vacuum chamber to a normal temperature for filming instead of waiting for the chamber to be naturally cooled. As described above, the aforementioned problem can be solved by integrating the above sequences in an optimal manner.

As for the time period for evacuation, a time period required to achieve high and ultra-high vacuums is much greater than a time required to attain low and medium vacuums from the air. More particularly, it is necessary to reduce the amount of gas molecules absorbed on the inner wall of a vacuum chamber in order to obtain an ultra-high vacuum. Since the total number of the absorbed gas molecules is fixed under the optimal condition in the vacuum chamber leak, it is important how to quickly desorb the gas molecules to perform evacuation. To promote discharge of gas, an operation called "baking", or evacuating while heating the vacuum chamber is generally employed. Since this baking is needed to form an ultra-high vacuum in a conventional semiconductor manufacturing apparatus, such as a sputtering apparatus, it takes a long period of time to rewarm the apparatus after exchanging of a target for a new target thereby resulting in many problems such as, for example, a reduction in the working ratio. Therefore, it is essential to shorten the baking time in order to obtain an ultra-high vacuum in a short time. As a result of detailed analysis of time distribution in baking and the notice that a time for cooling is longer than a time for heating, in accordance with the present invention a vacuum chamber is provided with a cooling pipeline.

Furthermore, a high speed exhaust pump is required, with the high speed pump having a high pumping speed with respect to water. For this purpose, there is provided a cooling baffle having a temperature such set to that the pumping speed is low with respect to argon gas needed in sputtering and high with respect to water. The operation of a main pump is continued so as to shorten the warm-up time period of main pump after the apparatus is opened or communicated with the air for discharging a target and, and a switching operation of a valve is linked to the operation of the main pump.

DESCRIPTION OF THE PREFERRED EMBODIMENTS

Figure 1:
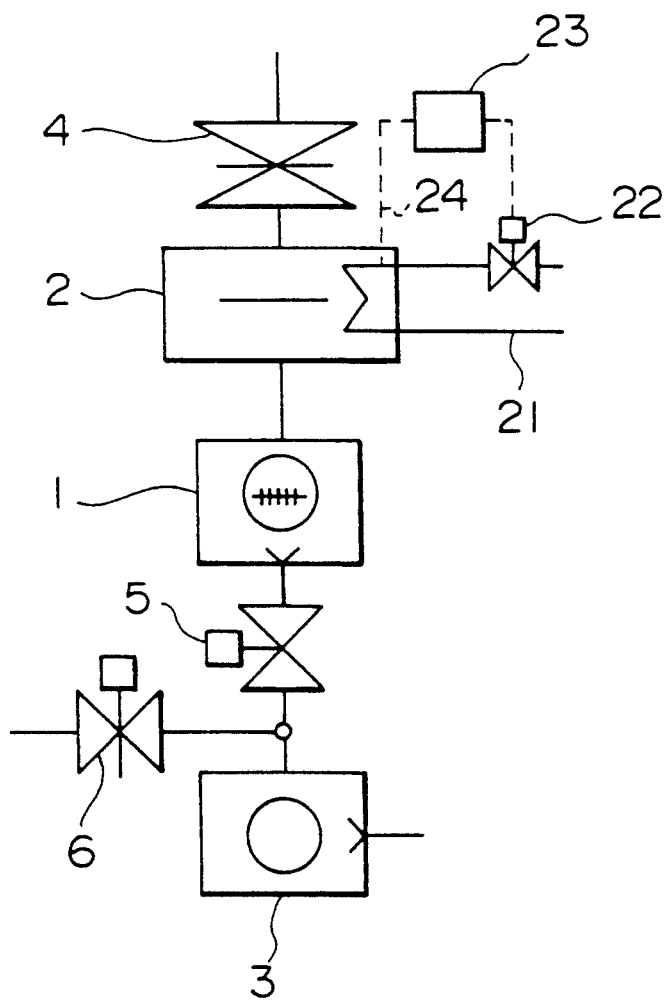
FIG. 1 is a schematic view of a system constructed in accordance with the present invention.

As shown in FIG. 1, a turbo-molecular pump 1 serving as a main pump is connected to a cooling baffle 2 and an auxiliary pump 3 through a valve. An upstream valve 4, disposed upstream of the cooling baffle 2, is connected to an vacuum chamber (not shown). The upstream valve 4 is preferably fashioned as a gate valve or the like having a great conductance is preferable in order to prevent the pumping speed from decreasing. The turbo-molecular pump 1 and the auxiliary pump 3 are connected through a valve 5, and a valve 6 is connected to an inlet of the auxiliary pump 3. A coolant introducing pipe 21 for cooling the cooling baffle 2 has a control valve 22 for controlling the cooling temperature of the cooling baffle 2 by controlling the flow rate of a cooling medium. The degree of opening of the control valve 22 is controlled by a control device 23 in response to a signal from a temperature detector 24 for detecting the temperature of the cooling baffle 2. Although not shown, the cooling temperature of the cooling baffle 2 may be controlled by making the flow rate of the cooling medium constant and controlling the heating amount of a heating means mounted in the cooling baffle 2.

With respect to the exhaust process of a high-speed exhaust system using the evacuation system shown in FIG. 1, open ends of the upstream valve 4 and the valve 6 shown in FIG. 1 are connected to a vacuum container (not shown).

While the vacuum chamber is communicated with the air, the upstream valve 4 and the valve 5 are closed, and the turbo-molecular pump 1 and the cooling baffle 2 are in the rated operational state. In this state, the valve 6 is opened and the operation of the auxiliary pump 3 is started. When the pressure in the vacuum chamber becomes low enough to perform exhaust by the turbo-molecular pump 1, the valve 6 is closed and the valve 5 and the upstream valve 4 are opened. Thereby, the exhaust continues to form a low vacuum region to medium and high vacuum regions. Since the exhaust capabilities of the cooling baffle 2 with respect to, particularly, water, is increased, water serving as the main ingredient gas in the middle to high vacuum regions, is exhausted at a high speed.

Figure 2:
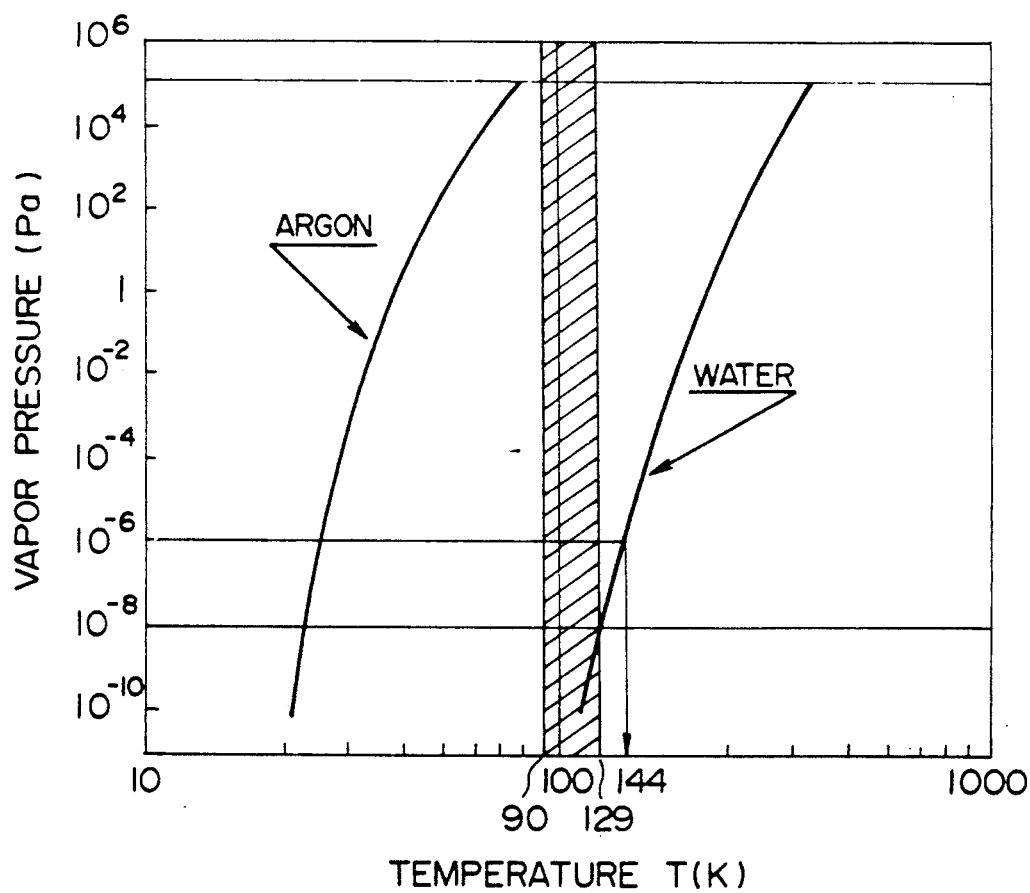
FIG. 2 is a graphical illustration of a relationship between the vapor pressures of argon and water.

In a sputtering apparatus using argon gas, the temperature of the cooling baffle 2 is in a range of 90K to 144K. The reason for setting, vapor pressure curves with respect to argon and water are best illustrated in the graph of FIG. 2. More particularly, the boiling point of argon is 87.26K, and argon is vaporized above a temperature of 90K. Although argon is absorbed on a baffle of the cooling baffle 2 at 90K, the amount of absorbed argon is less than an amount when the cooling baffle 2 is cooled to a liquid nitrogen temperature (77K). Since a satisfactory vapor pressure of water is $10^{-6}$Pa, the cooling baffle 2 is cooled to 144K, as shown in FIG. 2. In other words, a state in which water is sufficiently exhausted and argon is not exhausted is formed by maintaining the temperature of the cooling baffle 2 in a cross-hatched portion of FIG. 2. Since argon is exhausted by the turbo-molecular pump 1 serving as a main pump, it is not necessary to regenerate the cooling baffle 2 in the same manner as when a cryopump is regenerated. Therefore, no time is lost by the regeneration of the cooling baffle 2, and thus a long operation time can be taken.

If the exhaust by the auxiliary pump 3 is switched to the exhaust by the turbo-molecular pump 1 and a very rapid pressure change occurs, a wide pressure range or compound turbo-molecular pump is used as the turbo-molecular pump 1 in order to prevent the turbo-molecular pump 1 from being damaged. Since the wide pressure range turbo-molecular pump can operate even in a high pressure region, reliability is further increased.

At a time t when exhaustion is performed from the atmospheric pressure to 0.1 Torr at a pumping speed S (1000 l/min.) by the auxiliary pump 3, the following relationship when a capacity V of the chamber is 100 l:

$$t = \frac{V}{S} \cdot \ln\left(\frac{P_0}{P}\right) \quad (1)$$
$$= 2.3 \cdot \frac{V}{S} \cdot \log\left(\frac{P_0}{P}\right)$$
$$= 54(s)$$

In other words, since 0.1 Torr is obtained within approximately one minute, the above problem can be solved by using a proper pumping speed of the auxiliary pump 3 and a proper type of the main pump 1.

Figure 3:
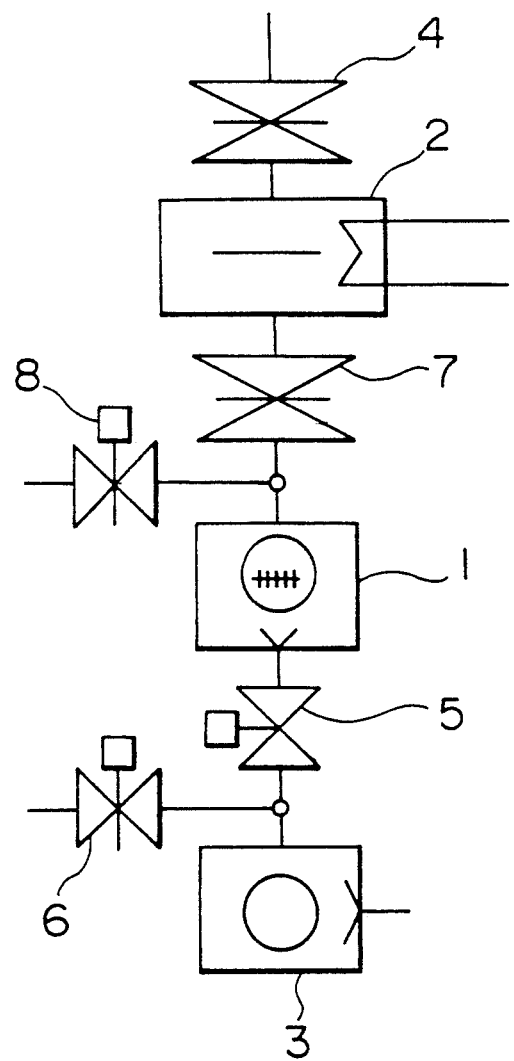
FIG. 3 is a schematic view of another embodiment of a system constructed in accordance with the present invention.
Figure 4:
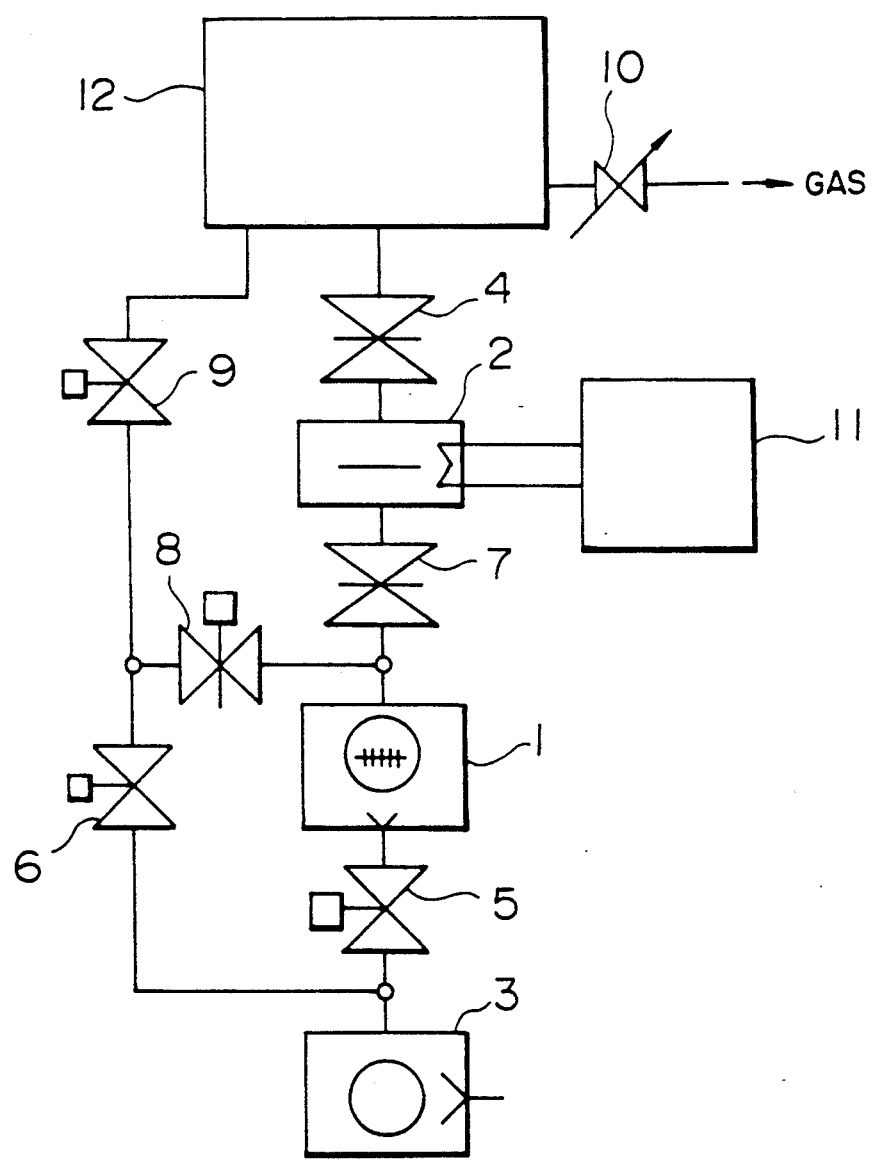
FIG. 4 is a schematic view of a further embodiment constructed in accordance with the present invention.

In the embodiment of FIG. 1, no valve is disposed between the main pump 1 and the cooling baffle 2. However, in the embodiment of FIGS. 3 and 4, a downstream valve 7 is interposed between a main pump 1 and a cooling baffle 2, and a pipeline diverging from the main pump 1 and a valve 8 are added. Preferably, the upstream valve 4 and the downstream valve 7 are constructed as a gate valve having a great conductance is to prevent the reduction of pumping speed. Referring to FIG. 4, the system shown in FIG. 3 is connected to a vacuum chamber 12 at the upstream valve 4. A pipeline serves to exhaust air by an auxiliary pump 3 from until a pressure capable of operating the main pump 1, with the pipeline being obtained is connected to the vacuum chamber 12 through a valve 9.

A shown in FIG. 4, the downstream valve 7, the valve 5 and the valve 8 are closed. The turbo-molecular pump 1 and the cooling baffle 2 are put into the rated operational state beforehand. In this state, a valve 6 and the valve 9 are opened and the operation of the auxiliary pump 3 is started. When the pressure in the vacuum chamber 12 becomes low enough to enable an exhaust by the turbo-molecular pump 1, the valve 6 is closed and the valves 5 and 8 are opened. Thereby the exhaust is conducted from a low vacuum region to medium and high vacuum regions. Then, the upstream valve 4 and the downstream valve 7 are opened and the valves 8 and 9 are closed. Since the exhaust ability of the cooling baffle 2 is thereby added and, in particular, the exhaust ability with respect to water is increased, water as the main residual gas in the medium and high vacuum regions is exhausted at high speed. In a sputtering apparatus using argon gas, the temperature of the cooling baffle 2 is set at 90K to 144K as described above. If an ultra-high vacuum is formed and then gas, such as argon, is supplied, it is possible in the embodiment of FIGS. 3 and 4 to avoid the route on the side of the cooling baffle 2. In other words, the argon gas can be exhausted in sputtering by closing the upstream valve 4 and the downstream valve 7 and opening the valves 8 and 9 without using the cooling baffle 2. In such a case, it is effective to use a wide pressure range type turbo-molecular pump which is capable of being used in a high pressure region as the main pump 1.

If the exhaustion by the auxiliary pump 3 is switched to the exhaust by the turbo-molecular pump 1 and a very rapid change arises in pressure, in order to prevent the turbo-molecular pump 1 from being damaged, two valves 8 are mounted in parallel, one of the valves 8 and 9 is used as a pipeline with an orifice and first opened, and then the other valve is opened. Furthermore, as described above, the same effect is obtained when the main pump 1 is a wide pressure range type turbo-molecular pump.

Although the above embodiment of FIGS. 3 and 4 can shorten reduce the pumping time, a method of further reducing the time will now be described. In the embodiment of FIGS. 3 and 4, discharge of the gas from the vacuum chamber is not taken into consideration. The amount of gas desorbed from the vacuum chamber 12 is generally decreased in proportion to a reciprocal of the time period. It is effective to accelerate the discharge of the gas so as to reduce the pumping time period. For example, the amount of desorbed gas is increased by heating the vacuum chamber 12. The example will be explained in connection with FIG. 5.

A pipeline for circulating a heating medium is mounted to a vacuum chamber 12 so as to rapidly heat and cool the vacuum chamber 12. The vacuum chamber 12 shown in FIG. 5 has a double wall through which the heating medium circulates around the vacuum chamber 12. A heating medium and a cooling medium can be switched by operation of valves disposed in the pipeline. It is thereby possible to heat and cool the vacuum chamber 12 in a short time period and to accelerate gas discharge. In baking of an ordinary vacuum device, a chamber is heated by a heater and cooled by natural heat radiation after baking. Therefore, cooling takes a longer time than heating. According to another method of the present invention, baking, that is heating of the vacuum chamber 12, is performed by supplying electricity to a heater in the same manner as before, and the vacuum chamber 12, after baking, can be rapidly cooled by circulating a cooling medium, for example, water. The amount of gas desorbed from the vacuum chamber 12 is decreased with cooling, and the pressure is lowered in a short time period.

Figure 5:
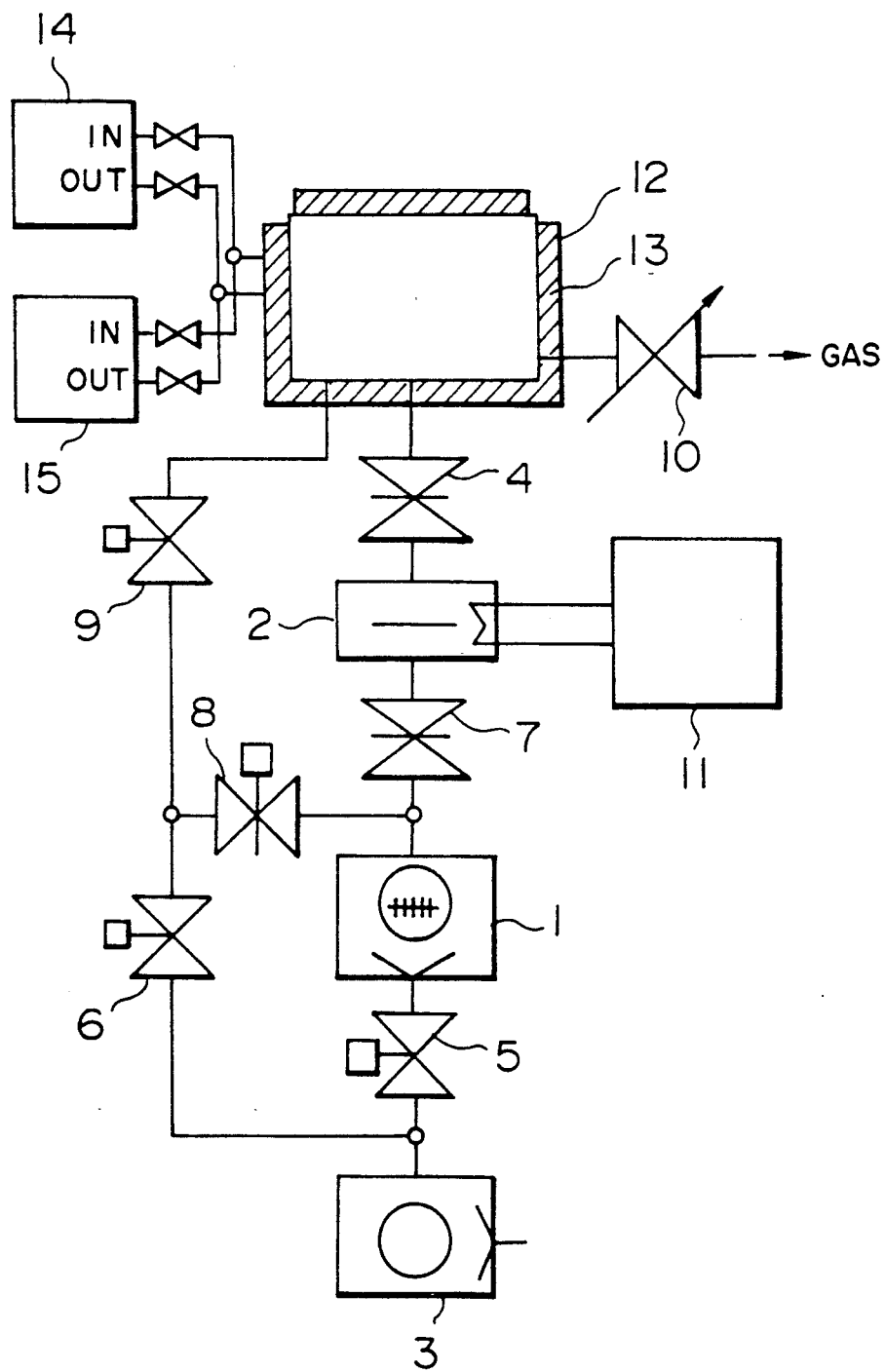
FIG. 5 is a schematic view of yet another embodiment constructed in accordance with the present invention.

Although not shown in FIG. 5, the discharge of gas may be accelerated by using a gas discharge method discharge cleaning and radiation by ultraviolet rays, infrared rays and the gas discharging method using radiation of microwaves, and the short-time period cooling may be carried out in the method of the present invention. In this case, the same advantageous effect can be obtained.

Furthermore, although not described, it is needless to say that leakage gas must be introduced through a cold trap or the like so as to include as little water as possible when the vacuum chamber 12 maintained at a vacuum is opened or communicates with the atmosphere so as to return the chamber to an atmospheric pressure state usually using $N_2$ gas.

What is claimed is:

1. An evacuation system, comprising:
   a main pump;
   an auxiliary pump disposed downstream of said main pump for operating said main pump;
   a cooling baffle disposed upstream of said main pump;
   a pipeline for linking said cooling baffle and vacuum container through a first valve; and
   a pipeline for linking said auxiliary pump and said vacuum container through a second valve,
   wherein said cooling baffle includes temperature control means for controlling a cooling temperature.

2. An evacuation system according to claim 1, wherein said temperature control means includes a temperature detector for detecting a temperature of said cooling baffle and a control device for controlling a degree of opening of a control valve provide in an inlet tube for supplying a cooling medium into said cooling baffle in response to a signal from said temperature detector.

3. An evacuation system, comprising:
   a main pump;
   an auxiliary pump disposed downstream of said main pump for operating said main pump;
   a cooling baffle disposed upstream of said main pump;
   a pipeline for linking said cooling baffle and vacuum container through a first valve; and
   a pipeline for linking said auxiliary pump and said vacuum container through a second valve,
   wherein a cooling temperature of said cooling baffle is controlled in accordance with the type of gas supplied to said vacuum chamber.

4. An evacuation system according to claim 3, wherein argon gas is supplied to said vacuum chamber, and wherein the cooling temperature of said cooling baffle is within a range of from 90K to 144K.

5. An evacuation system, comprising:
   a main pump;
   an auxiliary pump disposed downstream of said main pump for operating said main pump;
   a cooling baffle disposed upstream of said main pump;
   a first pipeline for linking said cooling baffle and vacuum container through a first valve; and
   a second pipeline for linking said auxiliary pump and said vacuum container through a second valve,
   wherein said third valve is interposed between said main pump and said cooling baffle and a further pipeline is disposed between said third valve and said main pump and connected to said vacuum chamber through a fourth valve.

6. An evacuation system according to claim 5, wherein a pipeline for introducing a medium into said vacuum chamber to heat or cool said vacuum chamber is mounted and formed with a switch valve for switching a heating medium and a cooling medium to be introduced.

7. An evacuation system according to claim 5, wherein said vacuum chamber is provide with means for heating said vacuum chamber and an inlet tube for introducing a cooling medium to cool said vacuum chamber.

8. An evacuation system according to claim 5, wherein a leakage valve is connected to a vacuum valve, and a tube connected to said leakage valve is cooled by a cooling medium of said cooling baffle.

9. An evacuation system, comprising:
a main pump;
an auxiliary pump disposed downstream of said main pump for operating said main pump;
a cooling baffle disposed upstream of said main pump;
a first pipeline for linking said cooling baffle and a vacuum container through a first valve; and
a second pipeline for linking said auxiliary pump and said vacuum container through a second valve,
wherein a third valve is interposed between said main pump and said cooling baffle, a further pipeline connected to said vacuum chamber is disposed between said third valve and said main pump, and
wherein two additional valves are disposed in parallel in said further pipeline, and an additional pipeline is connected to said auxiliary pump through a fourth valve interposed between said two additional valves.

10. An evacuation method of an evacuation system comprising a main pump, an auxiliary pump disposed downstream of said main pump for operating said main pump, a cooling baffle is disposed upstream of said main pump, a pipeline for linking said cooling baffle and a vacuum chamber through a first valve, and a pipeline for linking said auxiliary pump and said vacuum chamber through a second valve, said method comprising the steps of:
separating said cooling baffle, said main pump and said auxiliary pump by closing said first and second valves;
operating said cooling baffle and said main pump in a normal state when evacuation is started in a state where only an evacuation system between said vacuum chamber and said auxiliary pump is open;
evacuating said vacuum chamber by said auxiliary pump; and
operating said first and second valves to switch evacuation only by said auxiliary pump to evacuation by said auxiliary pump, said cooling baffle and said main pump.

11. An evacuation method according to claim 10, wherein a discharging of gas is conducted on said vacuum chamber after the evacuation by said auxiliary pump, said main pump and said cooling baffle is started, and then said vacuum chamber is rapidly cooled.

12. An evacuation method according to claim 11, wherein said first and second valves are closed when said vacuum chamber is communicated with the air, the operation of said cooling baffle and said main pump are continued, said vacuum chamber is communicated with air through a leakage valve.

* * * * *